(12) United States Patent
Kang et al.

(10) Patent No.: US 12,199,127 B2
(45) Date of Patent: Jan. 14, 2025

(54) IMAGE SENSOR

(71) Applicant: SAMSUNG ELECTRONICS CO., LTD., Suwon-si (KR)

(72) Inventors: Jeongsoon Kang, Gumi-si (KR); Mintae Ryu, Hwaseong-si (KR); Minsu Lee, Seongnam-si (KR); Wonsok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 522 days.

(21) Appl. No.: 17/528,237

(22) Filed: Nov. 17, 2021

(65) Prior Publication Data
US 2022/0302198 A1 Sep. 22, 2022

(30) Foreign Application Priority Data

Mar. 16, 2021 (KR) .................. 10-2021-0034208

(51) Int. Cl.
*H01L 27/146* (2006.01)
*H01L 27/148* (2006.01)

(52) U.S. Cl.
CPC .. *H01L 27/14643* (2013.01); *H01L 27/14603* (2013.01); *H01L 27/14612* (2013.01); *H01L 27/14636* (2013.01); *H01L 27/14831* (2013.01)

(58) Field of Classification Search
CPC ......... H01L 27/14643; H01L 27/14603; H01L 27/14612; H01L 27/14636; H01L 27/14831; H01L 27/1469; H01L 27/14634; H01L 27/1464; H01L 27/1462
See application file for complete search history.

(56) References Cited

U.S. PATENT DOCUMENTS

| 9,613,994 | B2 | 4/2017 | Yamashita |
| 10,090,349 | B2 | 10/2018 | Wan et al. |
| 10,163,946 | B2 | 12/2018 | Kwon |
| 10,403,659 | B2 | 9/2019 | Gambino et al. |
| 10,651,225 | B2 | 5/2020 | Hsuang et al. |

(Continued)

FOREIGN PATENT DOCUMENTS

| KR | 10-2017-0135309 | 12/2017 |
| WO | 2020/054282 | 3/2020 |

(Continued)

OTHER PUBLICATIONS

Geunsook Park et al., "A 2.2 μm stacked back side illuminated voltage domain global shutter CMOS image sensor", OmniVision Technology, Inc., 2019 IEEE, pp. IEDM19-378-IEDM19-381.

(Continued)

*Primary Examiner* — Tony Ko
(74) *Attorney, Agent, or Firm* — F. CHAU & ASSOCIATES, LLC

(57) ABSTRACT

An image sensor includes a first substrate. A photoelectric conversion region is in the first substrate. A first interlayer insulating layer is on the first substrate. A transistor includes a bonding insulating layer on the first interlayer insulating layer, a semiconductor layer on the bonding insulating layer, and a first gate on the semiconductor layer. A bias pad is spaced apart from the semiconductor layer by the bonding insulating layer. The bias pad overlaps the first gate in a planar view. A second interlayer insulating layer covers the transistor.

20 Claims, 14 Drawing Sheets

(56) References Cited

U.S. PATENT DOCUMENTS

| | | | |
|---|---|---|---|
| 2013/0285180 A1* | 10/2013 | Wang | H01L 27/14683 |
| | | | 257/E31.127 |
| 2019/0228908 A1 | 7/2019 | Gambino et al. | |
| 2019/0252443 A1 | 8/2019 | Kobayashi | |
| 2020/0035743 A1 | 1/2020 | Chen et al. | |
| 2020/0194541 A1 | 6/2020 | Tokuhara et al. | |
| 2020/0266229 A1 | 8/2020 | Takahashi et al. | |

FOREIGN PATENT DOCUMENTS

| | | |
|---|---|---|
| WO | 2020/059335 | 3/2020 |
| WO | 2020/075583 | 4/2020 |
| WO | 2020/080327 | 4/2020 |
| WO | 2020/080356 | 4/2020 |
| WO | 2020/100577 | 5/2020 |
| WO | 2020/100607 | 5/2020 |
| WO | 2020/100663 | 5/2020 |
| WO | 2020/105713 | 5/2020 |
| WO | 2020/121725 | 6/2020 |
| WO | 2020/121821 | 6/2020 |
| WO | 2020/122010 | 6/2020 |
| WO | 2020/129712 | 6/2020 |
| WO | 2020/137334 | 7/2020 |

OTHER PUBLICATIONS

Vincent C. Venezia, et al., "1.5 µm Dual Conversion Gain, Backside Illuminated Image Sensor Using Stacked Pixel Level Connections with 13ke- Full-Well Capacitance and 0.8e- Noise", OmniVision Technologies, 2018 IEEE, pp. EDM18-217-IEDM18-220.

\* cited by examiner

IMAGE SENSOR

CROSS-REFERENCE TO RELATED APPLICATION

This application claims priority under 35 U.S.C. § 119 to Korean Patent Application No. 10-2021-0034208, filed on Mar. 16, 2021 in the Korean Intellectual Property Office, the disclosure of which is incorporated by reference in its entirety herein.

1. TECHNICAL FIELD

The present inventive concept relates to an image sensor, and more particularly, to a complementary metal-oxide semiconductor (CMOS) image sensor.

2. DISCUSSION OF RELATED ART

An image sensor is a device that converts an optical image into an electrical signal. Image sensors may be used in a camera of a portable electronic device, such as a smartphone or tablet. A stacked image sensor has been developed for reduction of the size of the portable electronic device and to increase the performance of the camera. The stacked image sensor may reduce the planar area of the sensor, heighten resolution, and increase signal processing speed.

SUMMARY

An embodiment of the present inventive concept provides a stacked image sensor in which a threshold voltage of a transistor may be easily adjusted.

According to an embodiment of the present inventive concept, an image sensor includes a first substrate. A photoelectric conversion region is in the first substrate. A first interlayer insulating layer is on the first substrate. A transistor includes a bonding insulating layer on the first interlayer insulating layer, a semiconductor layer on the bonding insulating layer, and a first gate on the semiconductor layer. A bias pad is spaced apart from the semiconductor layer by the bonding insulating layer. The bias pad overlaps the first gate in a planar view. A second interlayer insulating layer covers the transistor.

According to an embodiment of the present inventive concept, an image sensor includes a substrate. A photoelectric conversion region is in the substrate. A transfer gate is on the substrate. A first interlayer insulating layer covers the substrate and the transfer gate. A first connection pad is positioned on the first interlayer insulating layer and is connected to the transfer gate. A bias pad is positioned on the first interlayer insulating layer. A bonding insulating layer is on the first interlayer insulating layer, the first connection pad, and the bias pad. A semiconductor layer is on the bonding insulating layer. A selection gate is positioned on the semiconductor layer and overlaps the bias pad in a planar view. A second interlayer insulating layer covers the selection gate. A first connection via penetrates the second interlayer insulating layer and the bonding insulating layer and directly contacts the first connection pad.

According to an embodiment of the present inventive concept, an image sensor includes a pixel structure. A logic structure is on the pixel structure. The pixel structure includes a first substrate. A photoelectric conversion region is in the first substrate. A first interlayer insulating layer is on the first substrate. A bonding insulating layer is on the first interlayer insulating layer. A semiconductor layer is on the bonding insulating layer. A gate is on the semiconductor layer. A bias pad is spaced apart from the semiconductor layer by the bonding insulating layer and overlaps the gate in a planar view. A second interlayer insulating layer covers the gate. A first bonding pad is positioned on the second interlayer insulating layer and is connected to the gate. The logic structure includes a second substrate. A logic circuit is on the second substrate. A third interlayer insulating layer covers the second substrate and the logic circuit. A second bonding pad is positioned on the third interlayer insulating layer and is connected to the logic circuit. The first bonding pad directly contacts the second bonding pad.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
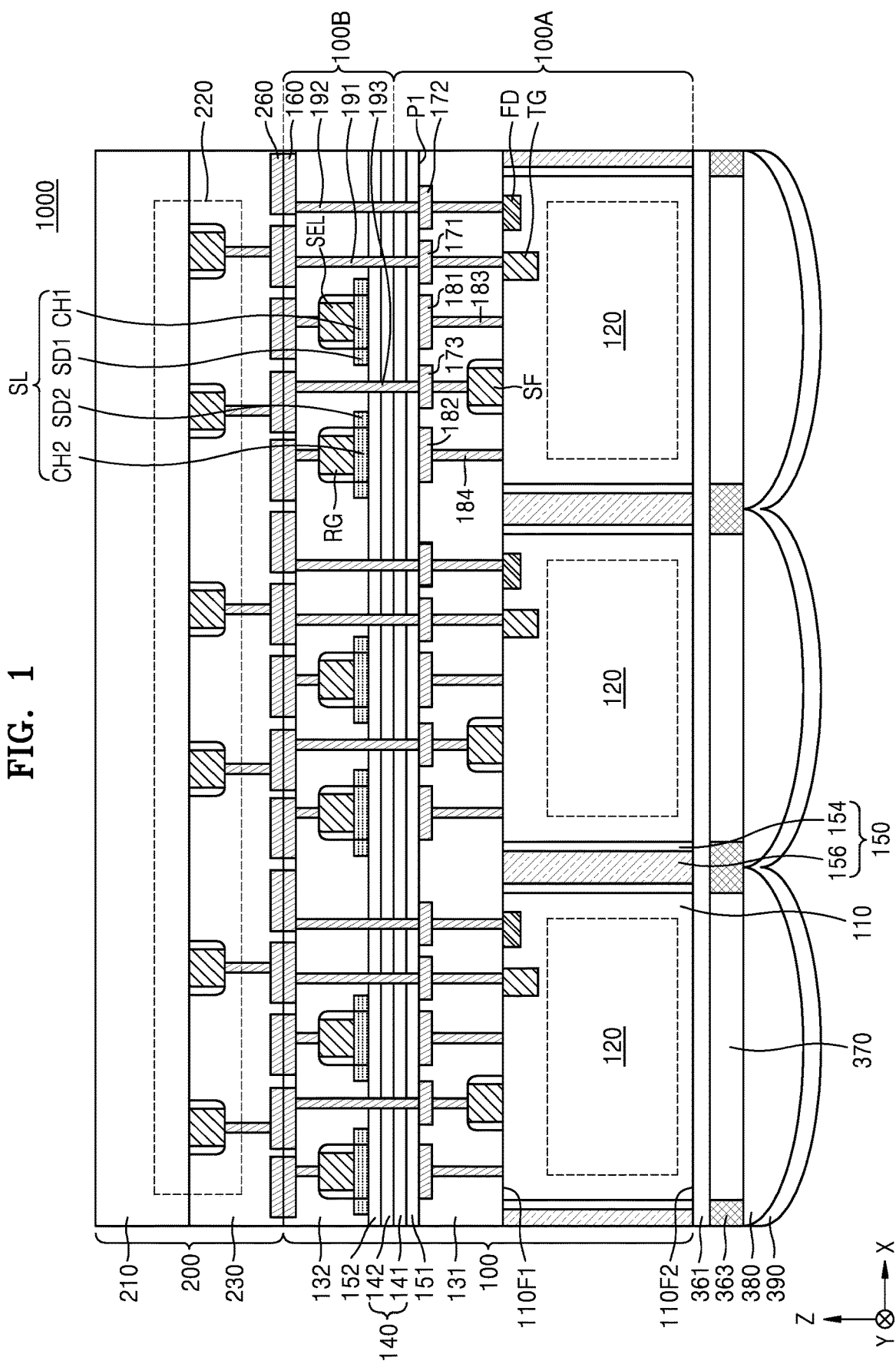
FIG. 1 is a cross-sectional view of an image sensor according to an embodiment of the present inventive concept.
Figure 3:
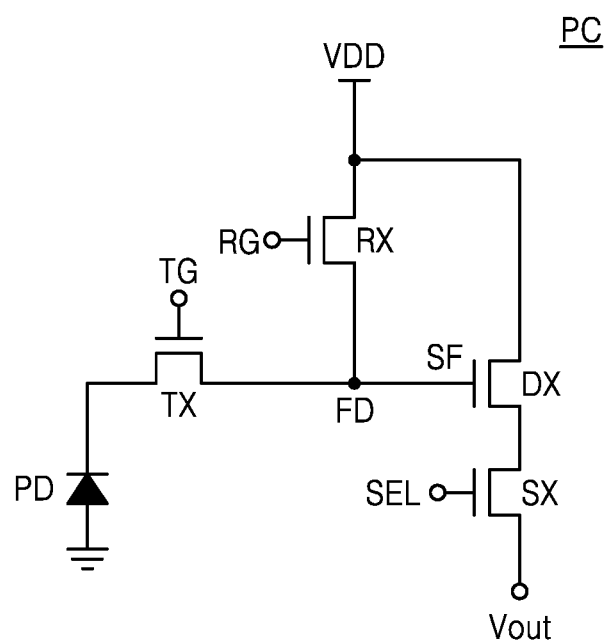
FIG. 3 is a circuit diagram of a pixel circuit included in an image sensor according to an embodiment of the present inventive concept.
Figure 4:
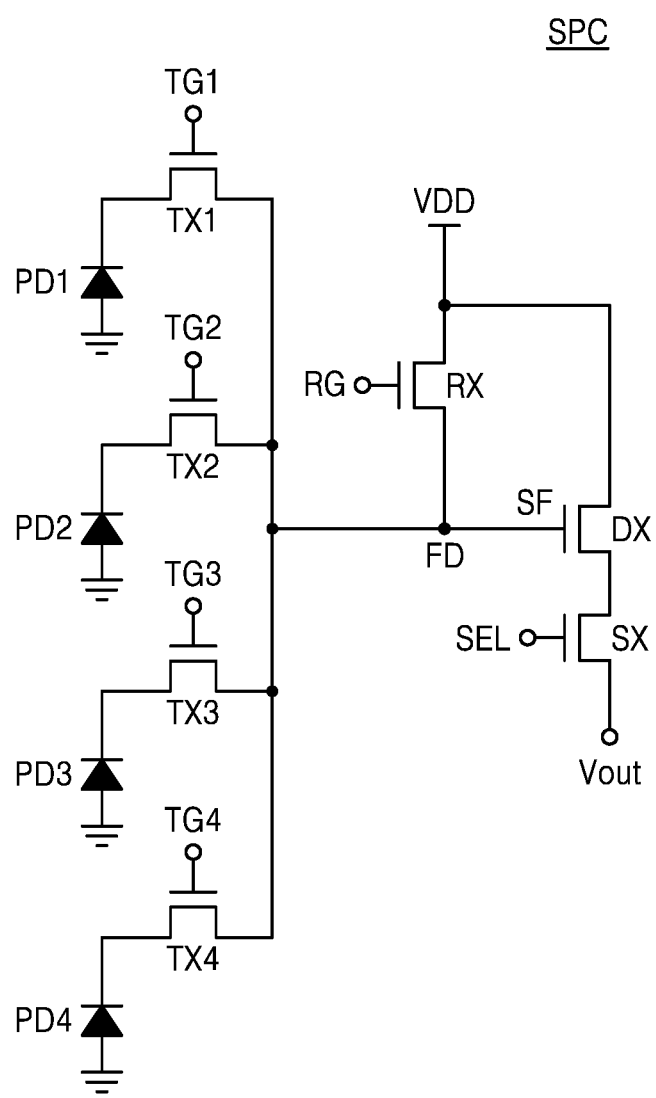
FIG. 4 is a circuit diagram of a shared pixel circuit included in an image sensor according to an embodiment of the present inventive concept.

FIG. 1 is a cross-sectional view of an image sensor 1000 according to an embodiment of the present inventive concept. FIG. 3 is a circuit diagram of a pixel circuit PC included in the image sensor 1000 according to an embodiment of the present inventive concept. FIG. 4 is a circuit diagram of a shared pixel circuit SPC included in the image sensor 1000 according to an embodiment of the present inventive concept.

Referring to FIGS. 1, 3, and 4, the image sensor 1000 may include a pixel structure 100 and a logic structure 200 on a first surface of the pixel structure 100. In some embodiments, the image sensor 1000 may further include an anti-reflection layer 361 on an opposite side of the pixel structure 100, such as a second surface of the pixel structure 100, a fence 363 on the anti-reflection layer 361, a color filter 370 surrounded by the fence 363, a micro lens 380 on the color filter 370, and a capping layer 390 on the micro lens 380.

The pixel structure 100 may include a photoelectric conversion region 120 in a first substrate 110, a first interlayer insulating layer 131 on the first substrate 110, a bonding insulating layer 140 on the first interlayer insulating layer 131, a semiconductor layer SL on the bonding insulating layer 140, a selection gate SEL on the semiconductor layer SL, a first bias pad 181 between the bonding insulating layer 140 and the first interlayer insulating layer 131, and a second interlayer insulating layer 132 covering the selection gate SEL. In some embodiments, the pixel structure 100 may further include a first bias via 183 that is in direct contact with the first bias pad 181. In some embodiments, the pixel structure 100 may further include a pixel isolation region 150 that surrounds the photoelectric conversion region 120. In some embodiments, the pixel structure 100 may further include a first bonding pad 160 connected to the selection gate SEL. In some embodiments, the pixel structure 100 may further include a first intervening layer 151 between the first interlayer insulating layer 131 and the bonding insulating layer 140, and a second intervening layer 152 between the semiconductor layer SL and the bonding insulating layer 140.

In some embodiments, the pixel structure 100 may further include a transfer gate TG on the first substrate 110, a first connection pad 171 connected to the transfer gate TG, and a first connection via 191 that directly contacts the first connection pad 171. In some embodiments, the pixel structure 100 may further include a floating diffusion region FD in the first substrate 110, a second connection pad 172 connected to the floating diffusion region FD, and a second connection via 192 that directly contacts the second connection pad 172. In some embodiments, the pixel structure 100 may further include a source follower gate SF on the first substrate 110, a third connection pad 173 connected to the source follower gate SF, and a third connection via 193 that directly contacts the third connection pad 173.

In some embodiments, the pixel structure 100 may further include a reset gate RG on the semiconductor layer SL. In some embodiments, the pixel structure 100 may further include a second bias pad 182 between the bonding insulating layer 140 and the first interlayer insulating layer 131. In some embodiments, the pixel structure 100 may further include a second bias via 184 that directly contacts the second bias pad 182.

The pixel structure 100 may include a first portion 100A, a second portion 100B on the first portion 100A, and a first connection via 191, a second connection via 192, and a third connection via 193, which connect the second portion 100B to the first portion 100A.

The first portion 100A of the pixel structure 100 may include the first substrate 110, the photoelectric conversion region 120, the pixel isolation region 150, the first interlayer insulating layer 131, the first bias pad 181, the first bias via 183, the second bias pad 182, the second bias via 184, the transfer gate TG, the first connection pad 171, the floating diffusion region FD, the second connection pad 172, the source follower gate SF, the third connection pad 173, the first intervening layer 151, and the first bonding insulating layer 141.

The second portion 100B of the pixel structure 100 may include a second bonding insulating layer 142, the second intervening layer 152, the semiconductor layer SL, the selection gate SEL, a reset gate RG, the second interlayer insulating layer 132, and the first bonding pad 160.

The first substrate 110 may include a first facet 110F1 and a second facet 110F2. In some embodiments, the first substrate 110 may include a semiconductor material such as a Group IV semiconductor material, a Group III-V semiconductor material, or a Group II-VI semiconductor material. In an embodiment, the Group IV semiconductor material may include, for example, silicon (Si), germanium (Ge), or Si—Ge. The Group III-V semiconductor material may include gallium arsenide (GaAs), indicum phosphate (InP), gallium phosphate (GaP), indium arsenide (InAs), indium antimony (InSb), or indium gallium arsenide (InGaAs). The Group II-V semiconductor material may include, for example, zinc telluride (ZnTe) or cadmium sulfide (CdS). In some embodiments, the first substrate 110 may be a silicon substrate. However, embodiments of the present inventive concept are not limited thereto. For example, in some embodiments, the first substrate 110 may be an organic plastic substrate.

In some embodiments, the first substrate 110 may include a P-type semiconductor substrate. For example, the first substrate 110 may include a P-type silicon substrate. In some embodiments, the first substrate 110 may include a P-type bulk substrate and a P-type or N-type semiconductor layer that is epitaxially grown on the P-type bulk substrate. However, embodiments of the present inventive concept are not limited thereto. For example, in some embodiments, the first substrate 110 may include an N-type bulk substrate and a P-type or N-type semiconductor layer that is epitaxially grown on the N-type bulk substrate.

The photoelectric conversion region 120 may be positioned within the first substrate 110. In the photoelectric conversion region 120, light that is incident through the second facet 110F2 of the first substrate 110 may be converted into an electrical signal. In some embodiments, the photoelectric conversion region 120 may include a photodiode (see PD of FIG. 3). In this embodiment, the photoelectric conversion region 120 may be formed by implanting impurities having a conductivity type opposite to the conductivity type of the first substrate 110 into the first substrate 110. The first substrate 110 and an impurity region having the conductivity type opposite to the conductivity type of the first substrate 110 may constitute the photodiode PD. However, embodiments of the present inventive concept are not limited thereto. For example, in an embodiment, the photoelectric conversion region 120 may include a phototransistor, a photogate, or a pinned photodiode.

The pixel isolation region 150 may be disposed within the first substrate 110 and may surround the photoelectric conversion region 120. In some embodiments, as shown in FIG. 1, the pixel isolation region 150 may completely penetrate the first substrate 110 and extend from the first facet 110F1 to the second facet 110F2 of the first substrate 110. However, embodiments of the present inventive concept are not limited thereto. For example, in an embodiment, unlike in FIG. 1, the pixel isolation region 150 may only partially penetrate the first substrate 110 and may not completely penetrate the first substrate 110. In the pixel isolation region 150, the first substrate 110 may be divided into a plurality of pixel regions arranged two-dimensionally, for example, in X and Y directions in a planar view. The X and Y directions may be parallel to an upper surface of the first substrate 110. The Z direction may extend in a thickness direction of the first substrate 110 and may be perpendicular to the X and Y directions. However, embodiments of the present inventive concept are not limited thereto. In the present specification, the planar view refers to a view in a vertical direction (e.g., the Z direction). For example, the planar view means projection onto the X-Y plane. In an embodiment, the pixel circuit PC shown in FIG. 3 may be arranged in each pixel region of the first substrate 110. The pixel isolation region 150 may electrically isolate the plurality of pixel circuits PC from each other.

In an embodiment, the pixel isolation region 150 may include a conductive layer 156 and an insulating liner 154 that surrounds the conductive layer 156. In some embodiments, each of the conductive layer 156 and the insulating liner 154 may completely penetrate the first substrate 110 and extend from the first facet 110F1 to the second facet 110F2 of the first substrate 110. However, embodiments of the present inventive concept are not limited thereto. For example, in an embodiment, unlike in FIG. 1, each of the conductive layer 156 and the insulating liner 154 may only partially penetrate the first substrate 110 and may not completely penetrate the first substrate 110. The insulating liner 154 may be arranged between the first substrate 110 and the conductive layer 156 to electrically isolate the conductive layer 156 from the first substrate 1110.

In some embodiments, the conductive layer 156 may include a conductive material such as polysilicon or metal. In some embodiments, the insulating liner 154 may include metal oxide such as hafnium oxide, aluminum oxide or tantalum oxide. In this embodiment, the insulating liner 154 may act as a negative fixed charge layer. In some embodiments, the insulating liner 154 may include another insulating material, such as silicon oxide, silicon nitride, silicon oxynitride, or a combination thereof. However, embodiments of the present inventive concept are not limited thereto.

The floating diffusion region FD may be positioned within the first substrate 110 (e.g., recessed into the first substrate 110) adjacent to the first facet 110F1 of the first substrate 110. In an embodiment, the floating diffusion region FD may be an impurity region formed by implanting impurities into the first substrate 110.

The transfer gate TG may be disposed on the first substrate 110. In some embodiments, as shown in FIG. 1, the transfer gate TG may be recessed into the first substrate 110 from the first facet 110F1 of the first substrate 110 and may be adjacent to the floating diffusion region FD. However, embodiments of the present inventive concept are not limited thereto. For example, in an embodiment, unlike in FIG. 1, the transfer gate TG may be disposed on the first facet 110F1 of the first substrate 110 and may extend above the first substrate 110 and not be recessed into the first substrate 110.

The source follower gate SF may be disposed on the first facet 110F1 of the first substrate 110 and may extend above the first facet 110F1.

The first interlayer insulating layer 131 may cover the first facet 110F1 of the first substrate 110, the transfer gate TG, the floating diffusion region FD, and the source follower gate SF. For example, in an embodiment, the first interlayer insulating layer 131 may cover upper surfaces of the first facet 110F1, the transfer gate TG and the floating diffusion region FD and upper and lateral side surfaces of the source follower gate SF. In an embodiment, the first interlayer insulating layer 131 may include silicon oxide, silicon nitride, silicon oxynitride, a low-k material, or a combination thereof. The low-k material may include, for example, flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate Glass (OSG), parylene, bis-benzocyclobutenes (BCB), SiLK, polyimide, porous polymeric material, or a combination thereof. However, embodiments of the present inventive concept are not limited thereto.

The bonding insulating layer 140 may be disposed on the first interlayer insulating layer 131, the first connection pad 171, the second connection pad 172, the third connection pad 173, the first bias pad 181, and the second bias pad 182 (e.g., in the Z direction). In some embodiments, the bonding insulating layer 140 may include the first bonding insulating layer 141 and the second bonding insulating layer 142, which directly contact each other. For example, as shown in the embodiment of FIG. 1, a lower surface of the second bonding insulating layer 142 may directly contact an upper surface of the first bonding insulating layer 141. In an embodiment in which the first bonding insulating layer 141 and the second bonding insulating layer 142 include the same material, the first bonding insulating layer 141 and the second bonding insulating layer 142 may be directly bonded to each other so that a boundary between the first bonding insulating layer 141 and the second bonding insulating layer 142 may not be clearly defined. In an embodiment, the first bonding insulating layer 141 and the second bonding insulating layer 142 may include, for example, silicon oxide ($SiO_2$), silicon nitride (SiN), silicon oxynitride (SiON), silicon carbonitride (SiCN), silicon oxycarbide (SiOC), or a combination thereof. However, embodiments of the present inventive concept are not limited thereto. For example, in an embodiment, the bonding insulating layer 140 may further include an adhesive layer between the first bonding insulating layer 141 and the second bonding insulating layer 142. However, embodiments of the present inventive concept are not limited thereto. For example, in some embodiments the bonding insulating layer 140 may include three or more bonding insulating layers.

The first intervening layer 151 may be disposed between the bonding insulating layer 140 and the first interlayer insulating layer 131 (e.g., in the Z direction). The second intervening layer 152 may be disposed between the bonding insulating layer 140 and the second interlayer insulating layer 132 (e.g., in the Z direction). In an embodiment, the first intervening layer 151 and the second intervening layer 152 may include, for example, silicon oxide ($SiO_2$), silicon nitride (SiN), silicon oxynitride (SiON), silicon carbonitride (SiCN), silicon oxycarbide (SiOC), or a combination thereof. However, embodiments of the present inventive concept are not limited thereto. The first intervening layer 151 and the second intervening layer 152 may include a different material from a material for forming the first bonding insulating layer 141 and the second bonding insulating layer 142. For example, in an embodiment, the first bonding insulating layer 141 and the second bonding insulating layer 142 may include silicon oxide ($SiO_2$), and the first intervening layer 151 and the second intervening layer 152 may include silicon carbonitride (SiCN).

The semiconductor layer SL may be disposed on the bonding insulating layer 140, for example, on the second intervening layer 152. In an embodiment, the semiconductor layer SL may include a semiconductor material such as a Group IV semiconductor material, a Group III-V semiconductor material, or a Group II-VI semiconductor material. The semiconductor layer SL may include, for example, Si. The semiconductor layer SL may include a first channel CH1 that overlaps the selection gate SEL in a planar view, a first source/drain pair SD1 at both lateral ends of the first channel CH1, a second channel CH2 that overlaps the reset gate RG, and a second source/drain pair SD2 at both lateral ends of the second channel CH2. The first source/drain pair SD1 and the second source/drain pair SD2 may be doped with impurities. In some embodiments, the first channel CH1 and the second channel CH2 may not be doped with impurities.

The selection gate SEL may be disposed on the semiconductor layer SL and may overlap the first bias pad 181 in a planar view. The selection gate SEL, the first channel CH1, the first source/drain pair SD1, and the bonding insulating layer 140 may constitute a selection transistor SX shown in FIG. 3. The selection transistor SX may further include the first intervening layer 151 and the second intervening layer 152. The reset gate RG may be disposed on the semiconductor layer SL and may overlap the second bias pad 182 in a planar view. The reset gate RG, the second channel CH2, the second source/drain pair SD2, and the bonding insulating layer 140 may constitute a reset transistor RX shown in FIG. 3. The reset transistor RX may further include the first intervening layer 151 and the second intervening layer 152.

In some embodiments, the selection transistor SX and the reset transistor RX shown in FIG. 3 may be fully depleted silicon on insulator (FD SOI) transistors or partially depleted silicon on insulator (PD SOI) transistors. The thickness of the semiconductor layer SL (e.g., length in the Z direction) may be sufficiently small so that the FD SOI transistors or PD SOI transistors may be formed. For example, in an embodiment, the FD SOI transistor, the thickness of the semiconductor layer SL may be less than or equal to about 10 nm. However, it may be difficult to manufacture the semiconductor layer SL having a uniform thickness in a range of about 1 nm or less. Thus, in an embodiment, the thickness of the semiconductor layer SL for forming the FD SOI transistor may be in a range of about 1 nm to about 10 nm.

The photodiode PD of FIG. 3 corresponding to the photoelectric conversion region 120 of FIG. 1, the transfer transistor TX including the transfer gate TG, the floating diffusion region FD, the reset transistor RX including the reset gate RG, the source follower transistor DX including the source follower gate SF, and the selection transistor SX including the selection gate SEL may constitute the pixel circuit PC.

The photodiode PD may generate electric charges, for example, electrons and holes, according to the amount of incident light. The transfer gate TG may transmit the electric charges generated by the photodiode PD to the floating diffusion region FD. The floating diffusion region FD may accumulate electric charges.

In an embodiment, the source follower transistor DX may generate a source-drain current according to the amount of photocharges accumulated in the floating diffusion region FD. The source follower transistor DX may amplify a potential change in the floating diffusion region FD as a buffer amplifier and may output an amplified signal through the selection transistor SX to an output line Vout. The source follower gate SF may be connected to the floating diffusion region FD, a drain of the source follower transistor DX may be connected to a power supply voltage VDD, and a source of the source follower transistor DX may be connected to a drain of the selection transistor SX.

The reset transistor RX may periodically reset charges accumulated in the floating diffusion region FD. A drain electrode of the reset transistor RX may be connected to the floating diffusion region FD, and a source electrode of the reset transistor RX may be connected to the power supply voltage VDD. In an embodiment, when the reset transistor RX is turned on, the power supply voltage VDD connected to the source electrode of the reset transistor RX may be transmitted to the floating diffusion region FD. When the reset transistor RX is turned on, charges accumulated in the floating diffusion region FD may be discharged so that the floating diffusion region FD may be reset.

The selection transistor SX may be a transistor serving as a switch and may be used to select a plurality of pixel circuits PC in a row unit. In an embodiment, when the selection transistor SX is turned on, the power supply voltage VDD connected to a drain electrode of the source follower transistor DX may be transmitted as a source electrode of the source follower transistor DX.

In some embodiments, as shown in FIG. 4, the plurality of pixel circuits PC may share the floating diffusion region FD, the reset transistor RX, the source follower transistor DX, and the selection transistor SX. The plurality of pixel circuits PC that share the floating diffusion region FD, the reset transistor RX, the source follower transistor DX and the selection transistor SX may form a shared pixel circuit SPC (FIG. 4).

For example, in an embodiment as shown in FIG. 4, the shared pixel circuit SPC may include a plurality of transfer transistors TX1 through TX4 respectively including a plurality of photodiodes PD1 through PD4 and a plurality of transfer gates TG1 through TG4, the floating diffusion region FD, the reset transistor RX, the source follower transistor DX, and the selection transistor SX. The plurality of photodiodes PD1 through PD4 may be respectively connected to the plurality of transfer transistors TX1 through TX4, and the plurality of transfer transistors TX1 through TX4 may be connected to one floating diffusion region FD. For example, charges generated in each of the photodiodes PD1 through PD4 may be transmitted to the floating diffusion region FD by each of the transfer gates TG1 through TG4 and may be accumulated in the floating diffusion region FD. However, embodiments of the present inventive concept are not limited thereto and the numbers of the photodiodes, transfer gates and transfer transistors in the shared pixel circuit SP4 may vary, such as five or more.

As shown in FIG. 1, the second interlayer insulating layer 132 may cover the selection gate SEL and the reset gate RG. In some embodiments, the second interlayer insulating layer 132 may further cover the semiconductor layer SL and the bonding insulating layer 140. In some embodiments, the second interlayer insulating layer 132 may further cover the second intervening layer 152. In an embodiment, the second interlayer insulating layer 132 may include silicon oxide, silicon nitride, silicon oxynitride, a low-k material, or a combination thereof. However, embodiments of the present inventive concept are not limited thereto.

The first bias pad 181 and the second bias pad 182 may be disposed between the first interlayer insulating layer 131 and the bonding insulating layer 140, such as between the first interlayer insulating layer 131 and the first intervening layer 151. The first bias pad 181 and the second bias pad 182 may be spaced apart from the semiconductor layer SL by the bonding insulating layer 140. For example, the first bias pad 181 and the second bias pad 182 may be spaced apart from the semiconductor layer SL by the bonding insulating layer 140, the first intervening layer 151, and the second intervening layer 152.

The first bias pad 181 may overlap the selection gate SEL in a planar view. The second bias pad 182 may overlap the reset gate RG in the planar view. Voltage may be applied to the first bias pad 181 and the second bias pad 182 and the first bias pad 181 and the second bias pad 182 may be configured to receive the voltage. For example, in an embodiment, voltage may be applied to the first bias pad 181 so that a threshold voltage of the selection transistor SX of FIG. 3 may be adjusted. Voltage may be applied to the second bias pad 182 so that the threshold voltage of the reset transistor RX may be adjusted. For example, the selection transistor SX and the reset transistor RX of FIG. 3 are FD SOI transistors or PD SOI transistors, and threshold voltages of the selection transistor SX and the reset transistor RX of FIG. 3 may be easily adjusted by using the first bias pad 181 and the second bias pad 182.

In some embodiments, as shown in FIG. 1, a top surface of the first bias pad 181 may be coplanar with a top surface of the first interlayer insulating layer 131. For example, the top surface of the first bias pad 181 and the top surface of the first interlayer insulating layer 131 may be positioned in the same plane P1. For example, as shown in the embodiment of FIG. 1, a height of the top surface of the first bias pad 181 (e.g., length in the Z direction from the first substrate 110) may be the same as a height of the top surface of the first interlayer insulating layer 131. In some embodiments, as shown in FIG. 1, a top surface of the second bias pad 182 may be coplanar with the top surface of the first interlayer insulating layer 131. For example, the top surface of the second bias pad 182 and the top surface of the first interlayer insulating layer 131 may be positioned in the same plane P1.

In an embodiment, the first bias pad 181 and the second bias pad 182 may include a metal material, such as copper (Cu), aluminum (Al), or tungsten (W). However, embodiments of the present inventive concept are not limited thereto. In some embodiments, the first bias pad 181 and the second bias pad 182 may further include a barrier material disposed between the metal material and the first interlayer insulating layer 131. In an embodiment, the barrier material may include, for example, tantalum nitride (TaN) or titanium nitride (TiN). However, embodiments of the present inventive concept are not limited thereto.

The first bias via 183 may penetrate the first interlayer insulating layer 131 and may directly contact the first bias pad 181. The second bias via 184 may penetrate the first interlayer insulating layer 131 and may directly contact the second bias pad 182. For example, as shown in FIG. 1, upper surfaces of the first and second bias vias 183, 184 may directly contact lower surfaces of the first and second bias pads 181, 182, respectively.

In some embodiments, the first bias via 183 may extend between the first substrate 110 and the first bias pad 181 (e.g., in the Z direction). The second bias via 184 may extend between the first substrate 110 and the second bias pad 182 (e.g., in the Z direction). In this embodiment, voltage may be applied to the first substrate 110 so that the voltage may be applied to the first bias pad 181 and the second bias pad 182.

However, embodiments of the present inventive concept are not limited thereto. For example, in an embodiment, the pixel structure 100 may further include a conductive line positioned within or disposed on the first substrate 110. In an embodiment, the conductive line may include, for example, polysilicon or metal. However, embodiments of the present inventive concept are not limited thereto. In some embodiments, the conductive line may be connected to the logic structure 200. The first bias via 183 may extend between the conductive line and the first bias pad 181, and the second bias via 184 may extend between the conductive line and the second bias pad 182. In this embodiment, voltage may be applied to the first bias pad 181 through the logic structure 200, the conductive line, and the first bias via 183, and voltage may be applied to the second bias pad 182 through the logic structure 200, the conductive line, and the second bias via 184.

In an embodiment, the first bias via 183 and the second bias via 184 may include a metal material, such as Cu, Al, or W. However, embodiments of the present inventive concept are not limited thereto. In some embodiments, the first bias via 183 and the second bias via 184 may further include a barrier material disposed between the metal material and the first interlayer insulating layer 131. In an embodiment, the barrier material may include, for example, TaN or TiN. However, embodiments of the present inventive concept are not limited thereto.

The first connection pad 171, the second connection pad 172, and the third connection pad 173 may be disposed between the first interlayer insulating layer 131 and the bonding insulating layer 140, for example, between the first interlayer insulating layer 131 and the first intervening layer 151. The first connection pad 171 may be connected to the transfer gate TG. The second connection pad 172 may be connected to the floating diffusion region FD. The third connection pad 173 may be connected to the source follower gate SF.

In some embodiments, the top surface of the first connection pad 171 may be coplanar with the top surface of the first interlayer insulating layer 131. For example, the top surface of the first connection pad 171 and the top surface of the first interlayer insulating layer 131 may be positioned in the same plane P1. In some embodiments, a top surface of the second connection pad 172 may be coplanar with the top surface of the first interlayer insulating layer 131. For example, the top surface of the second connection pad 172 and the top surface of the first interlayer insulating layer 131 may be positioned in the same plane P1. In some embodiments, a top surface of the third connection pad 173 may be coplanar with the top surface of the first interlayer insulating layer 131. For example, the top surface of the third connection pad 173 and the top surface of the first interlayer insulating layer 131 may be positioned in the same plane P1.

In an embodiment, the first connection pad 171, the second connection pad 172, and the third connection pad 173 may include a metal material, such as Cu, Al, or W. However, embodiments of the present inventive concept are not limited thereto. In some embodiments, the first connection pad 171, the second connection pad 172, and the third connection pad 173 may further include a barrier material disposed between the metal material and the first interlayer insulating layer 131. In an embodiment, the barrier material may include, for example, TaN or TiN. However, embodiments of the present inventive concept are not limited thereto.

The first connection via 191 may penetrate the second interlayer insulating layer 132 and the bonding insulating layer 140 and may directly contact the first connection pad 171. For example, a lower surface of the first connection via 191 may directly contact the first connection pad 171. For example, another pad may not be present between the first connection via 191 and the second connection pad 172. In some embodiments, as shown in FIG. 1, the first connection via 191 may further penetrate the first intervening layer 151 and the second intervening layer 152.

The second connection via 192 may penetrate the second interlayer insulating layer 132 and the bonding insulating layer 140 and may directly contact the second connection pad 172. For example, a lower surface of the second connection via 192 may directly contact the second connection pad 172. For example, another pad may not be present between the second connection via 192 and the second connection pad 172. In some embodiments, as shown in FIG. 1, the second connection via 192 may further penetrate the first intervening layer 151 and the second intervening layer 152.

The third connection via 193 may penetrate the second interlayer insulating layer 132 and the bonding insulating layer 140 and may directly contact the third connection pad 173. For example, a lower surface of the third connection via 193 may directly contact the third connection pad 173. For example, another pad may not be present between the third connection via 193 and the third connection pad 173. In some embodiments, as shown in FIG. 1, the third connection via 193 may further penetrate the first intervening layer 151 and the second intervening layer 152.

In embodiments in which the first connection via 191, the second connection via 192, and the third connection via 193 are formed to extend only up to the first connection pad 171, the second connection pad 172, and the third connection pad 173, lengths in the vertical direction (e.g., the Z direction) of the first connection via 191, the second connection via 192, and the third connection via 193 may be reduced, compared to an embodiment in which the first connection via 191, the second connection via 192, and the third connection via 193 are formed to extend to the transfer gate TG, the floating diffusion region FD, and the source follower gate SF, respectively. Thus, the difficulty of a process of forming the first connection via 191, the second connection via 192, and the third connection via 193 may be reduced by using the first connection pad 171, the second connection pad 172, and the third connection pad 173.

Also, even when slight misalignment is present between the first connection pad 171 and the first connection via 191, the second connection pad 172 and the second connection via 192, and the third connection pad 173 and the third connection via 193, contact between the first connection pad 171 and the first connection via 191, the second connection pad 172 and the second connection via 192, and the third connection pad 173 and the third connection via 193 may be ensured by the first connection pad 171, the second connection pad 172, and the third connection pad 173, respectively. Thus, the difficulty of a process of forming the first connection via 191, the second connection via 192, and the third connection via 193 may be reduced by using the first connection pad 171, the second connection pad 172, and the third connection pad 173.

In an embodiment, the first connection via 191, the second connection via 192, and the third connection via 193 may include a metal material, such as Cu, Al, or W. However, embodiments of the present inventive concept are not limited thereto. In some embodiments, the first connection via 191, the second connection via 192, and the third connection via 193 may further include a barrier material disposed between the metal material and the second interlayer insulating layer 132, a barrier material disposed between the metal material and the bonding insulating layer 140, a barrier material disposed between the metal material and the first intervening layer 151, and a barrier material disposed between the metal material and the second intervening layer 152. In an embodiment, the barrier material may include, for example, TaN or TiN. However, embodiments of the present inventive concept are not limited thereto.

The plurality of first bonding pads 160 may be positioned on the second interlayer insulating layer 132. The plurality of first bonding pads 160 may be connected to the selection gate SEL, the reset gate RG, the first connection via 191, the second connection via 192, and the third connection via 193, respectively. For example, an upper surface of the first connection via 191, the second connection via 192 and the third connection via 193 may directly contact a lower surface of the first bonding pad 160 for direct connection thereto. In an embodiment, the plurality of first bonding pads 160 may include a metal material, such as Cu, Al, or W. However, embodiments of the present inventive concept are not limited thereto. In some embodiments, the plurality of first bonding pads 160 may further include a barrier material disposed between the metal material and the second interlayer insulating layer 132. In an embodiment, the barrier material may include, for example, TaN or TiN. However, embodiments of the present inventive concept are not limited thereto.

The logic structure 200 may be positioned on the plurality of first bonding pads 160 and the second interlayer insulating layer 132. The logic structure 200 may include a second substrate 210, a logic circuit 220 on the second substrate 210, a third interlayer insulating layer 230 covering the second substrate 210 and the logic circuit 220, and a plurality of second bonding pads 260 on the third interlayer insulating layer 230.

In an embodiment, the second substrate 210 may include a semiconductor material such as a Group IV semiconductor material, a Group III-V semiconductor material, or a Group II-VI semiconductor material. In some embodiments, the second substrate 210 may be a silicon substrate. The logic circuit 220 may be positioned on the second substrate 210. In some embodiments, the logic circuit 220 may include a plurality of transistors on the second substrate 210. The third interlayer insulating layer 230 may cover the second substrate 210 and the logic circuit 220. In an embodiment, the third interlayer insulating layer 230 may include silicon oxide, silicon nitride, silicon oxynitride, a low-k material, or a combination thereof. However, embodiments of the present inventive concept are not limited thereto.

The plurality of second bonding pads 260 may be positioned on the third interlayer insulating layer 230 and may be connected to the logic circuit 220. In an embodiment, the plurality of second bonding pads 260 may include a metal material such as Cu, Al, or W. However, embodiments of the present inventive concept are not limited thereto. In some embodiments, the plurality of second bonding pads 260 may further include a barrier material disposed between the metal material and the third interlayer insulating layer 230. In an embodiment, the barrier material may include, for example, TaN or TiN. However, embodiments of the present inventive concept are not limited thereto. The plurality of second bonding pads 260 may directly contact the plurality of first bonding pads 160. For example, as shown in FIG. 1, a lower surface of the second bonding pads 260 may directly contact an upper surface of the first bonding pads 160. The pixel structure 100 and the logic structure 200 may be bonded to each other by integrated bonding between the plurality of second bonding pads 260 and the plurality of first bonding pads 160.

In some embodiments, unlike in FIG. 1, the logic structure 200 may be formed on a lateral side of the pixel structure 100. For example, the first substrate 110 and the second substrate 210 may be different portions of the same wafer. In this embodiment, the first bonding pad 160 and the second bonding pad 260 are omitted. Instead, a connection layer for connecting between the logic circuit 220 and the pixel circuit (see PC of FIG. 3) may be further formed on the second interlayer insulating layer 132.

The anti-reflection layer 361 may be positioned on the second facet 110F2 of the first substrate 110. In some embodiments, the anti-reflection layer 361 may include hafnium oxide, silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), or yttrium oxide ($Y_2O_3$). However, embodiments of the present inventive concept are not limited thereto.

The fence 363 may be positioned on the anti-reflection layer 361. The fence 363 may overlap the pixel isolation region 150 in a planar view. In some embodiments, the fence 363 may include a low refractive index material. For example, in an embodiment, the low refractive index material may have a refractive index in a range of about 1.0 to about 1.4. For example, the low refractive index material may include polymethylmetacrylate (PMMA), silicon acrylate, cellulose acetate butyrate (CAB), silica, or fluorosilicon acrylate (FSA). For example, the low refractive index material may include a polymer material in which silica (SiOx) particles are dispersed.

The color filter 370 may be positioned on the anti-reflection layer 361 and may be surrounded by the fence 363. The plurality of color filters 370 may include, for example, a green filter, a blue filter, and a red filter. However, embodiments of the present inventive concept are not limited thereto. For example, in an embodiment, the plurality of color filters 170 may include, for example, a cyan filter, a magenta filter, and a yellow filter.

The micro lens 380 may be positioned on the color filter 370 and the fence 363. In a planar view, one micro lens 380 may be arranged to correspond to one photoelectric conversion region 120. In an embodiment, the micro lens 380 may include, for example, styrene-based resin, acryl-based resin, styrene-acryl polymer-based resin, or siloxane-based resin. The micro lens 380 may collect incident light, and the collected light may be incident on the photoelectric conversion region 120 through the color filter 370. The capping layer 390 may be arranged on the micro lens 380.

Figure 2:
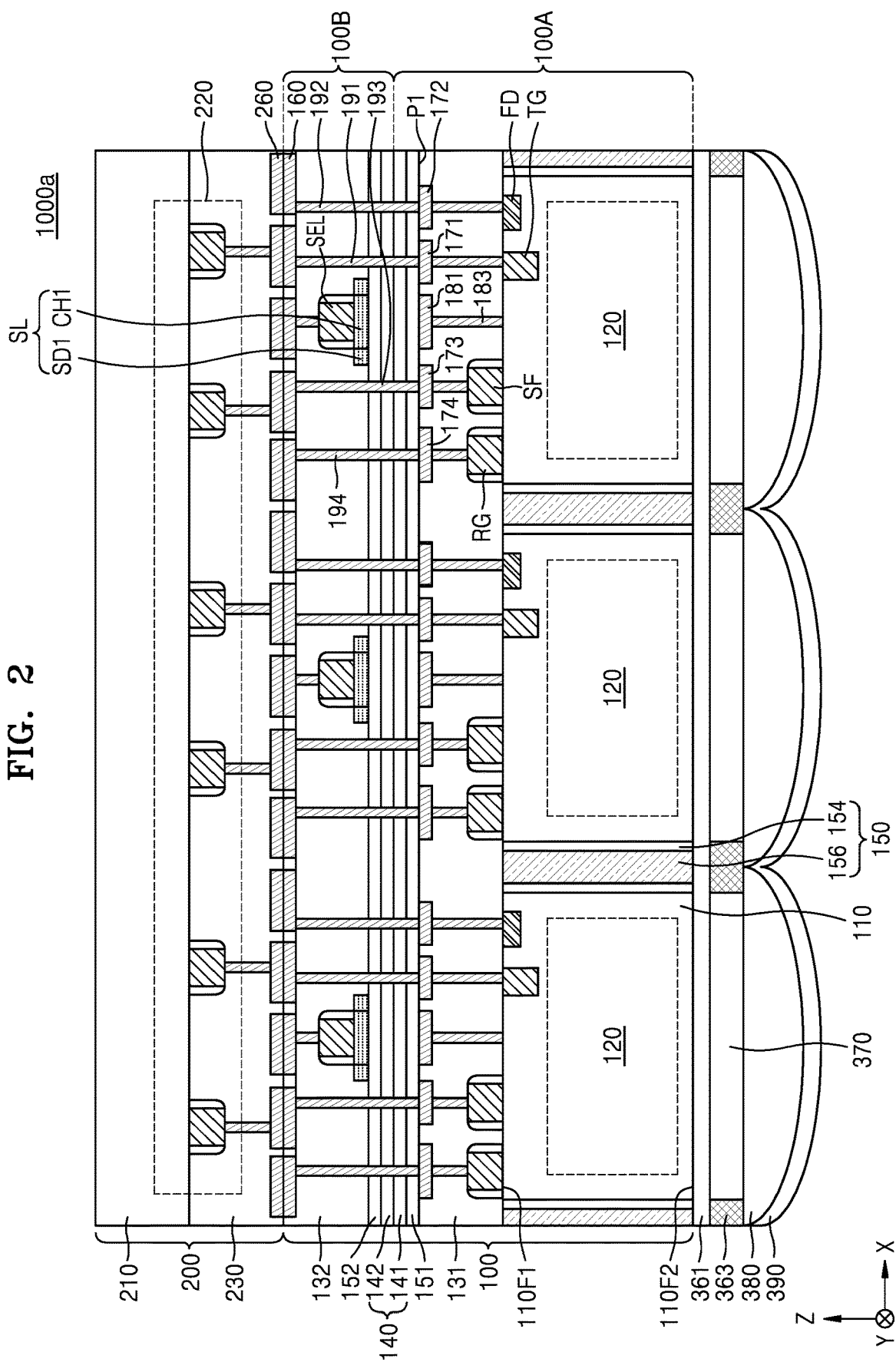
FIG. 2 is a cross-sectional view of an image sensor according to an embodiment of the present inventive concept.

FIG. 2 is a cross-sectional view of an image sensor 1000a according to an embodiment of the present inventive concept. Hereinafter, a difference between the image sensor 1000 shown in FIG. 1 and the image sensor 1000a shown in FIG. 2 will be described and a repeated description of similar or identical elements may be omitted for convenience of explanation.

Referring to FIG. 2, the reset gate RG may be disposed on the first substrate 110. For example, in an embodiment, a bottom surface of the reset gate RG may directly contact the first facet 110F1 of the first substrate 110 and may extend thereabove. The reset gate RG may be included in the first portion 100A of the pixel structure 100, instead of the second portion 100B of the pixel structure 100. The first portion 100A of the pixel structure 100 may further include a fourth connection pad 174 connected to the reset gate RG instead of the second bias pad 182 shown in FIG. 1. The fourth connection pad 174 may be disposed between the first interlayer insulating layer 131 and the bonding insulating layer 140. In some embodiments, a top surface of the fourth connection pad 174 may be coplanar with the top surface of the first interlayer insulating layer 131. For example, the top surface of the fourth connection pad 174 and the top surface of the first interlayer insulating layer 131 may be positioned in the same plane P1.

Also, the pixel structure 100 may further include a fourth connection via 194 that penetrates the second interlayer insulating layer 132 and the bonding insulating layer 140 and directly contacts the fourth connection pad 174. For example, the pixel structure 100 may further include the fourth connection via 194 for connecting the second portion 100B to the first portion 100A In some embodiments, as shown in FIG. 2, the fourth connection via 194 may further penetrate the first intervening layer 151 and the second intervening layer 152. The fourth connection via 194 may be connected to the first bonding pad 160.

In some embodiments, unlike FIG. 2, the semiconductor layer SL may further include a third channel and a third source/drain pair at both ends of the third channel, and the source follower gate SF may be arranged on the third channel of the semiconductor layer SL. In this embodiment, the pixel structure 100 may be spaced apart from the semiconductor layer SL by the bonding insulating layer 140 and may further include a third bias pad that overlaps the source follower gate SF in a planar view. In this embodiment, the pixel structure 100 may further include a third bias via that directly contacts a third bias pad.

FIGS. 5A through 5J are cross-sectional views illustrating a method of manufacturing an image sensor, according to embodiments of the present inventive concept.

Figure 5A:
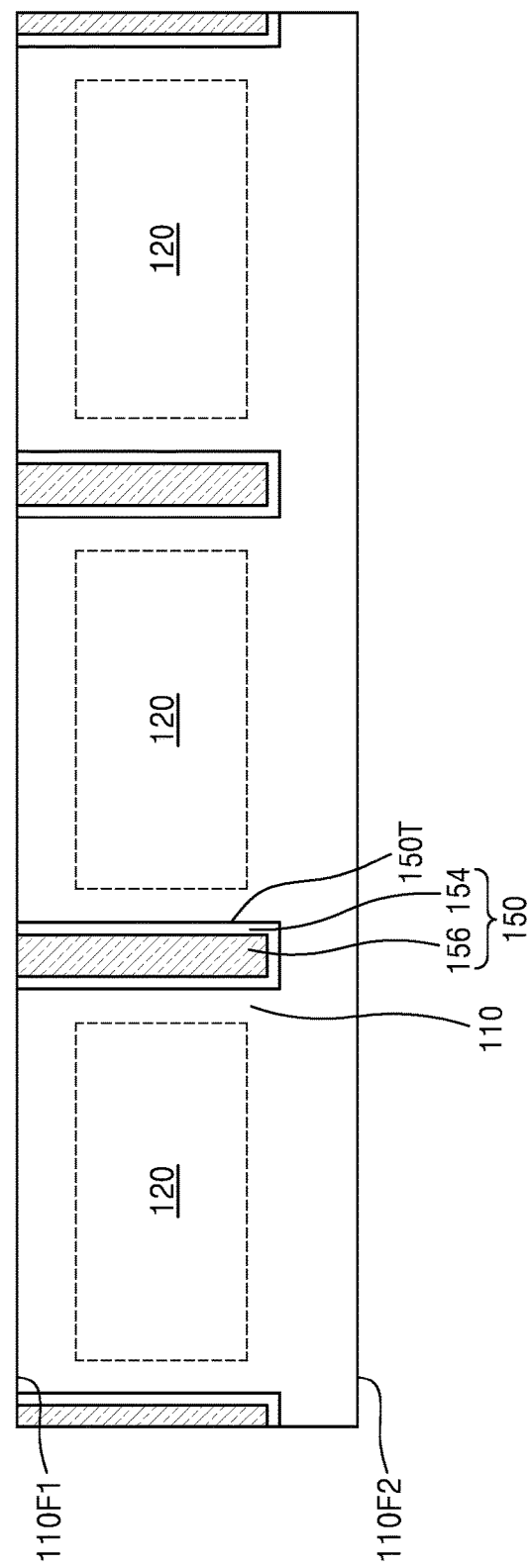
FIGS. 5A through 5J are cross-sectional views illustrating a method of manufacturing an image sensor, according to embodiments of the present inventive concept.

Referring to FIG. 5A, a first substrate 110 having a first facet 110F1 and a second facet 110F2 that face each other may be prepared. In an embodiment, a mask pattern may be formed on the first facet 110F1 of the first substrate 110, and a portion of the first substrate 110 may be removed from the first facet 110F1 of the first substrate 110 by using the mask pattern so that a trench 150T may be formed.

An insulating liner 154 and a conductive layer 156 may then be sequentially formed on the first facet 110F1 of the first substrate 110 and the trench 150T. In an embodiment, portions of the insulating liner 154 and the conductive layer 156, arranged on the first facet 110F1 of the first substrate 110, may be removed by a planarization process so that the pixel isolation region 150 may be formed in the trench 150T.

Also, a photoelectric conversion region 120 may be formed in the first substrate 110 by an ion implantation process from the first facet 110F1 of the first substrate 110.

Figure 5B:
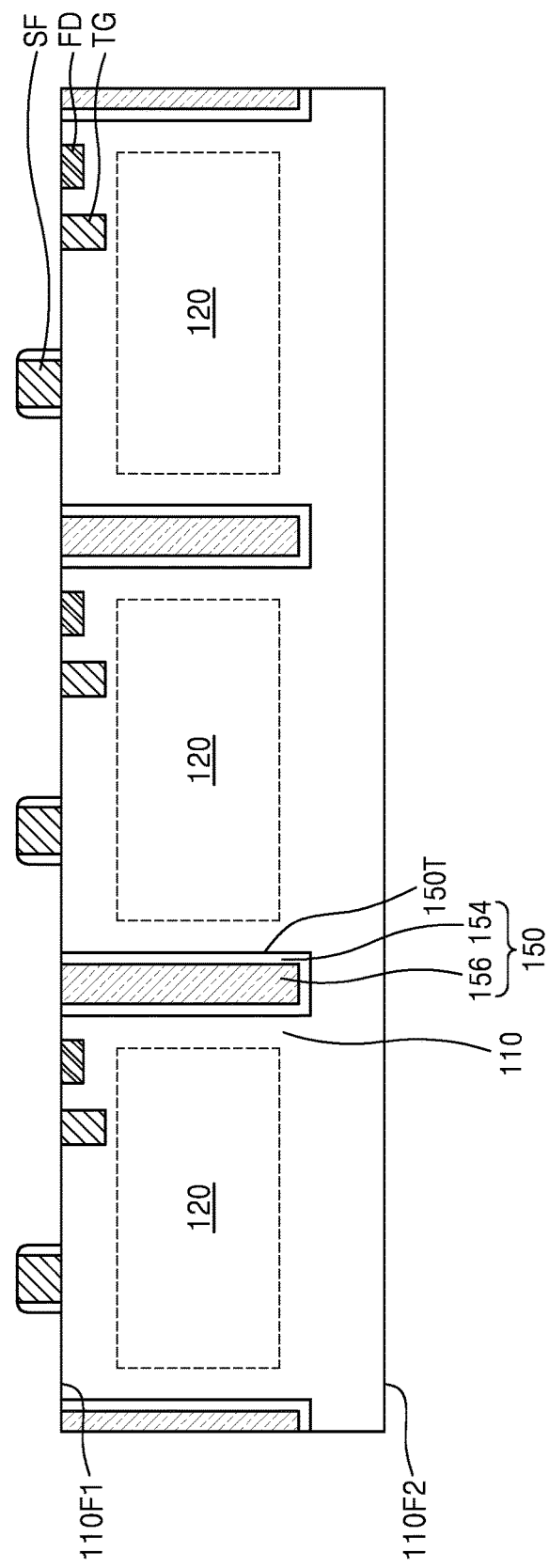

Referring to FIG. 5B, a transfer gate TG that extends from the first facet 110F1 of the first substrate 110 to the inside of the first substrate 110, and a source follower gate SF on the first facet 110F1 of the first substrate 110 and extending above the first substrate 110 may be formed. Also, a floating diffusion region FD may be formed by an ion implantation process from the first facet 110F1 of the first substrate 110.

Figure 5C:
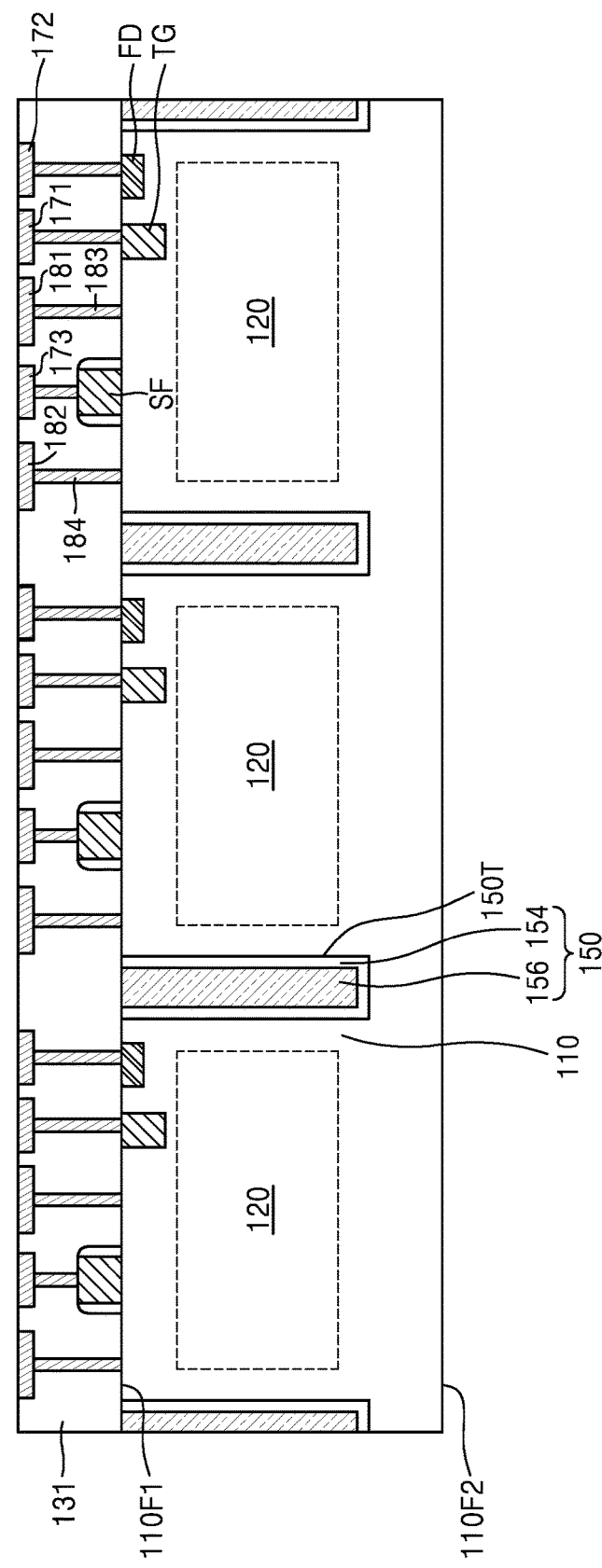

Referring to FIG. 5C, a first interlayer insulating layer 131 may be formed on the first facet 110F1 of the first substrate 110, the transfer gate TG, the source follower gate SF, and the floating diffusion region FD. A first bias via 183, a second bias via 184, a via for connecting the first connection pad 171 to the transfer gate TG, a via for connecting the second connection pad 172 to the floating diffusion region FD, a via for connecting the third connection pad 173 to the source follower gate SF, a first bias pad 181, a second bias pad 182, the first connection pad 171, the second connection pad 172, and the third connection pad 173 may be formed.

Figure 5D:
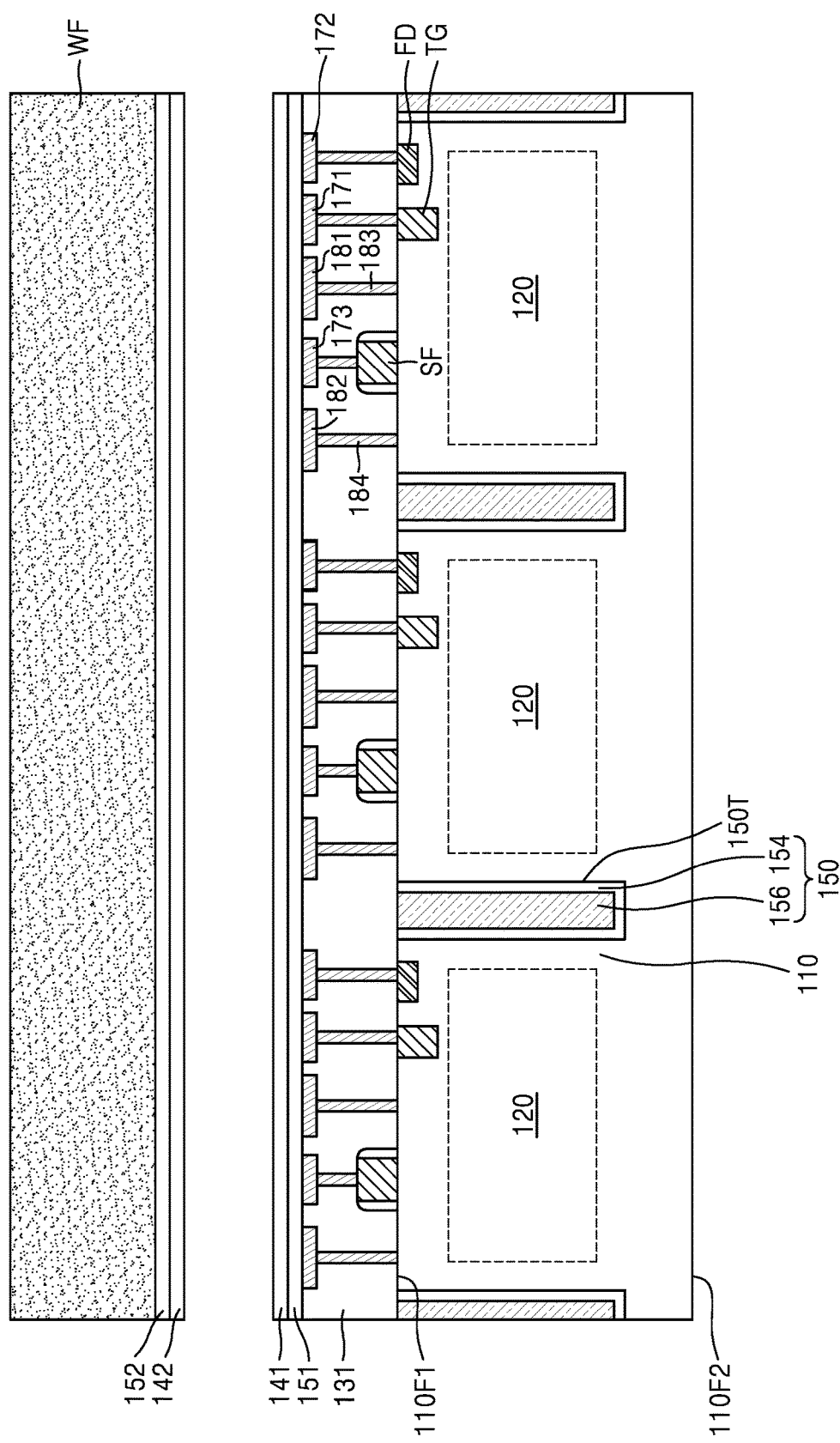

Referring to FIG. 5D, a first intervening layer 151 and a first bonding insulating layer 141 may be sequentially formed (e.g., in the Z direction) on the first interlayer insulating layer 131, the first bias pad 181, the second bias pad 182, the first connection pad 171, the second connection pad 172, and the third connection pad 173. In some embodiments, the formation of the first intervening layer 151 may be omitted. Also, a second intervening layer 152 and a second bonding insulating layer 142 may be sequentially formed on a semiconductor wafer WF. In some embodiments, the formation of the second intervening layer 152 may be omitted.

Figure 5E:
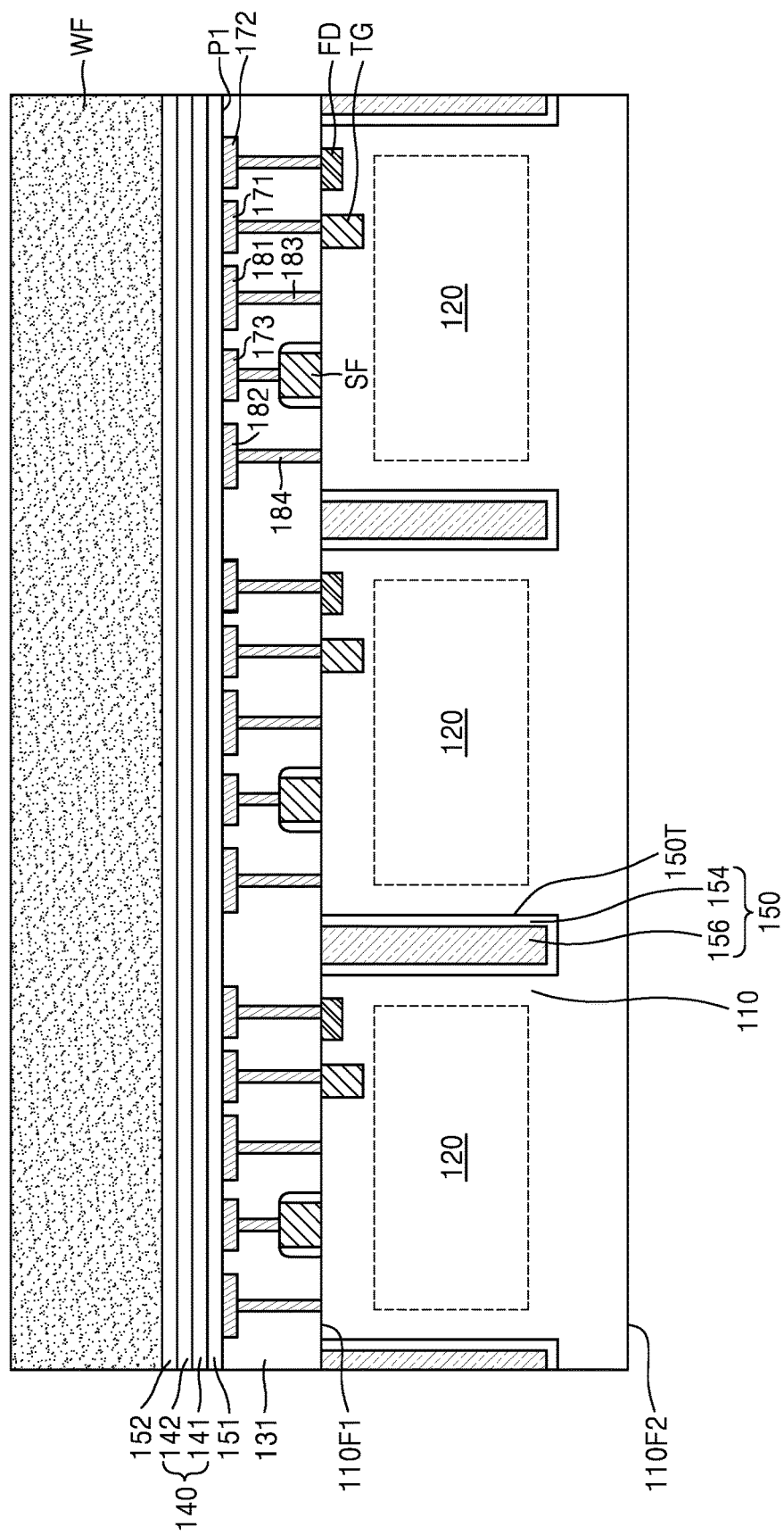

Referring to FIGS. 5D and 5E, the first bonding insulating layer 141 may be bonded to the second bonding insulating layer 142. For example, in an embodiment, the first bonding insulating layer 141 and the second bonding insulating layer 142 may be directly bonded to each other without an adhesive therebetween. In some embodiments, the first bonding insulating layer 141 may be directly bonded to the second bonding insulating layer 142 by applying heat and/or pressure to the first substrate 110 and/or the semiconductor wafer WF, or the first bonding insulating layer 141 and the second bonding insulating layer 142 may be plasma-treated in advance. However, embodiments of the present inventive concept are not limited thereto, and the first bonding insulating layer 141 may be bonded to the second bonding insulating layer 142 by Cu-through silicon via (TSV) bonding or Cu—Cu bonding. In this embodiment, a TSV may be formed in the first bonding insulating layer 141 and the second bonding insulating layer 142. A Cu bump may be formed on the surface of the TSV so that the first bonding insulating layer 141 and the second bonding insulating layer 142 may be connected to each other, or the first bonding insulating layer 141 and the second bonding insulating layer 142 may be connected to each other through the TSV. The first bonding insulating layer 141 and the second bonding insulating layer 142 may be adhered to each other directly or through the Cu bump.

Figure 5F:
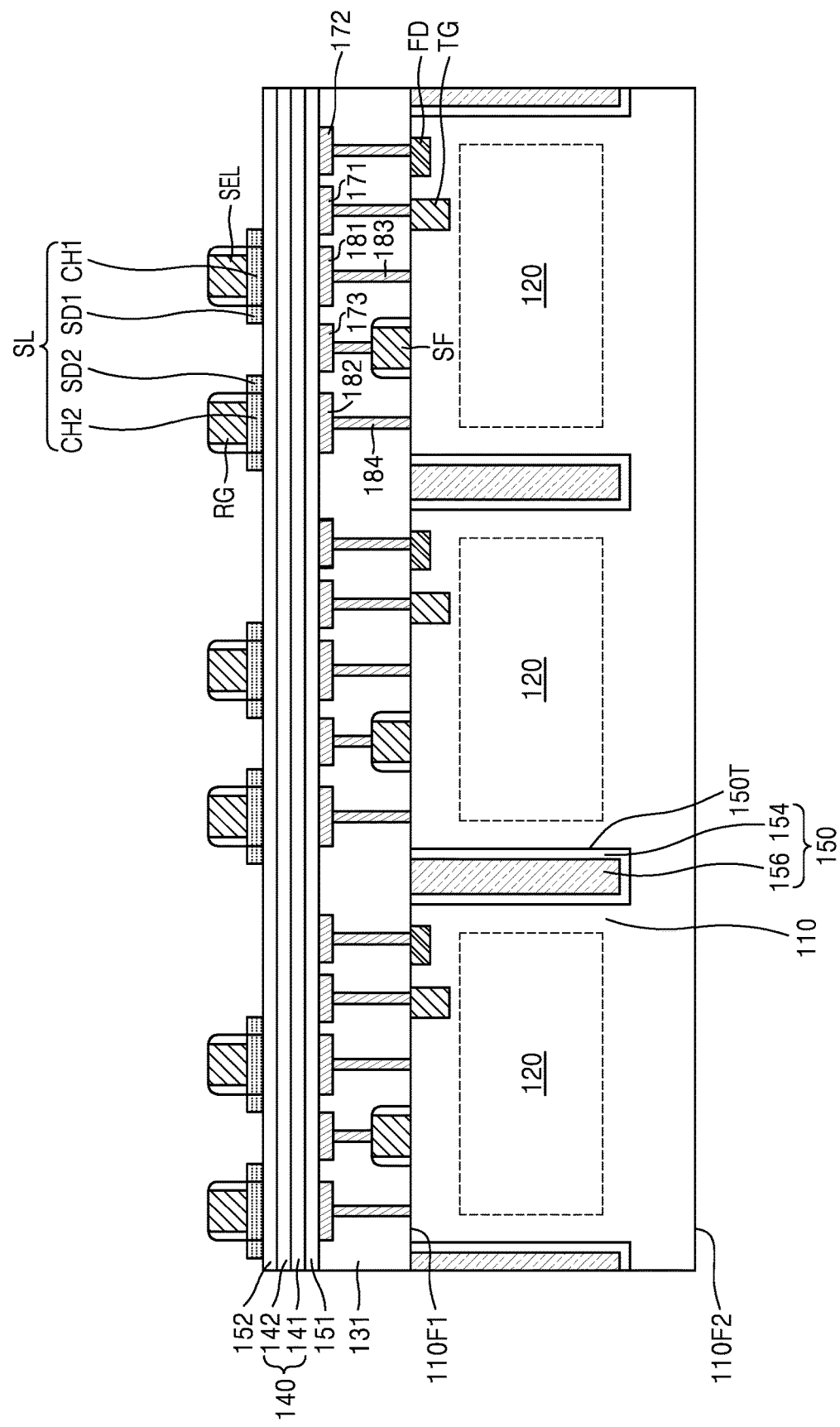

Referring to FIGS. 5E and 5F, the semiconductor wafer WF may be polished and thinned so that a portion of the semiconductor wafer WF may be removed and thus a semiconductor layer SL may be formed. The semiconductor layer SL may also be patterned. A reset gate RG and a selection gate SEL may be formed on the semiconductor layer SL. Portions of the semiconductor layer SL may be doped so that a first source/drain pair SD1 and a second source/drain pair SD2 may be formed in the semiconductor layer SL.

Figure 5G:
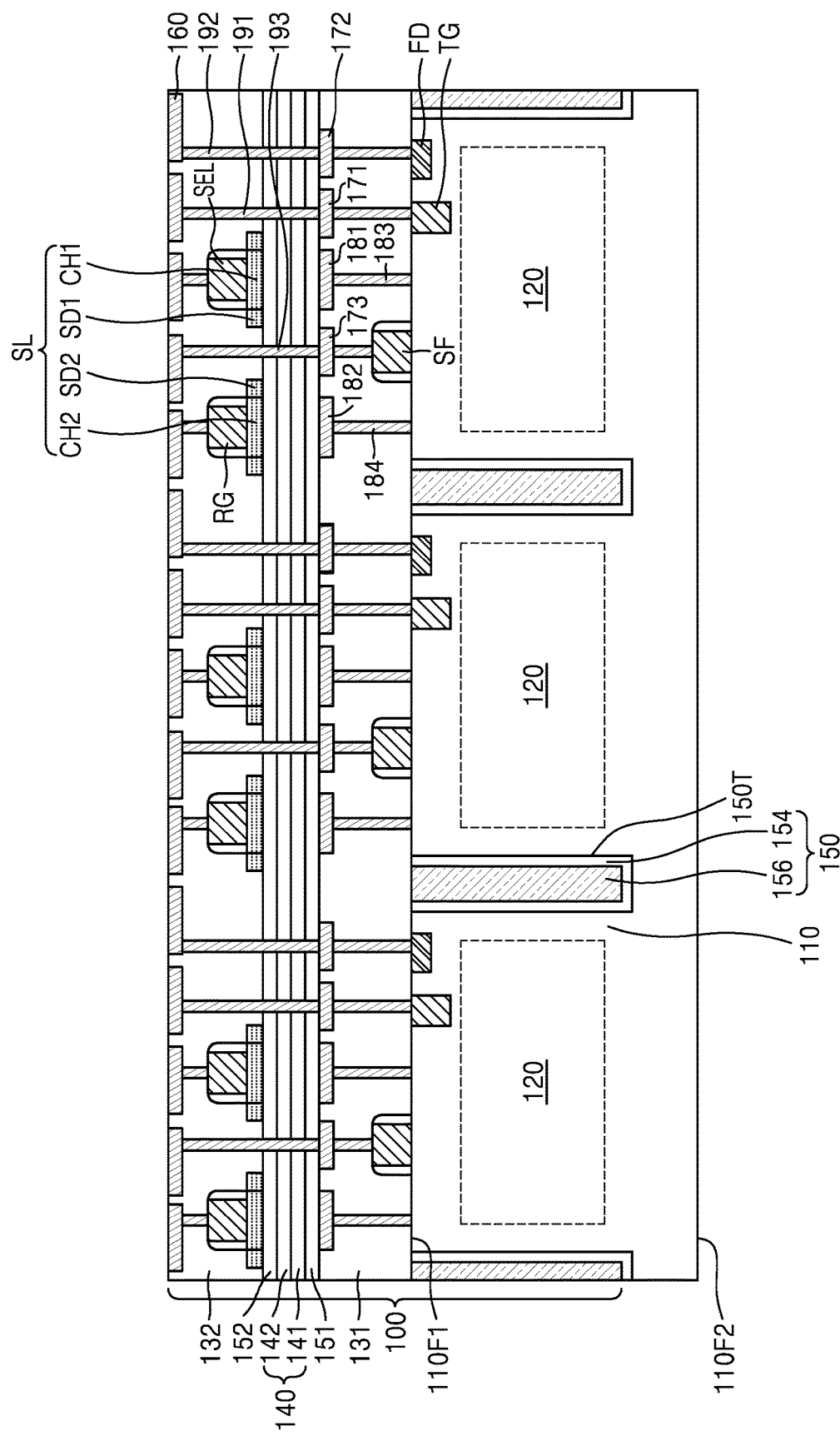

Referring to FIG. 5G, a second interlayer insulating layer 132 may be formed on the second intervening layer 152, the semiconductor layer SL, the reset gate RG, and the selection gate SEL. A first connection via 191, a second connection via 192, a third connection via 193, a via for connecting the selection gate SEL to the first bonding pad 160, and a via for connecting the reset gate RG to the first bonding pad 160 may be formed. Also, a plurality of first bonding pads 160 may be formed on the second interlayer insulating layer 132. Thus, a pixel structure 100 may be formed.

When the first connection via 191, the second connection via 192, and the third connection via 193 are formed to extend only up to the first connection pad 171, the second connection pad 172, and the third connection pad 173, lengths in the vertical direction (e.g., Z direction) of the first connection via 191, the second connection via 192, and the third connection via 193 may be reduced, compared to an embodiment in which the first connection via 191, the second connection via 192, and the third connection via 193 are formed to extend to the transfer gate TG, the floating diffusion region FD, and the source follower gate SF, respectively. Thus, the difficulty of a process of forming the first connection via 191, the second connection via 192, and the third connection via 193 may be reduced by using first connection pad 171, the second connection pad 172, and the third connection pad 173.

Also, even when there is slight misalignment present between the first connection pad 171 and the first connection via 191, the second connection pad 172 and the second connection via 192, and the third connection pad 173 and the third connection via 193, a contact between the first connection pad 171 and the first connection via 191, the second connection pad 172 and the second connection via 192, and the third connection pad 173 and the third connection via 193 may be maintained by the first connection pad 171, the second connection pad 172, and the third connection pad 173. Thus, the difficulty of a process of forming the first connection via 191, the second connection via 192, and the third connection via 193 may be reduced by using the first connection pad 171, the second connection pad 172, and the third connection pad 173.

Figure 5H:
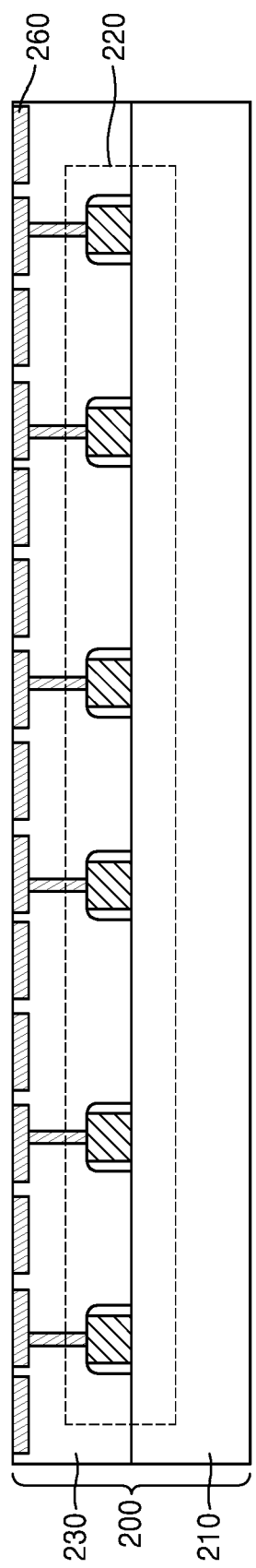

Referring to FIG. 5H, a logic structure 200 may be prepared. For example, a logic circuit 220 may be formed on the second substrate 210. A third interlayer insulating layer 230 may then be formed on the second substrate 210 and the logic circuit 220. A plurality of vias for penetrating the third interlayer insulating layer 230 and a plurality of second bonding pads 260 on the third interlayer insulating layer 230 may then be formed. Thus, the logic structure 200 may be formed.

Figure 5I:
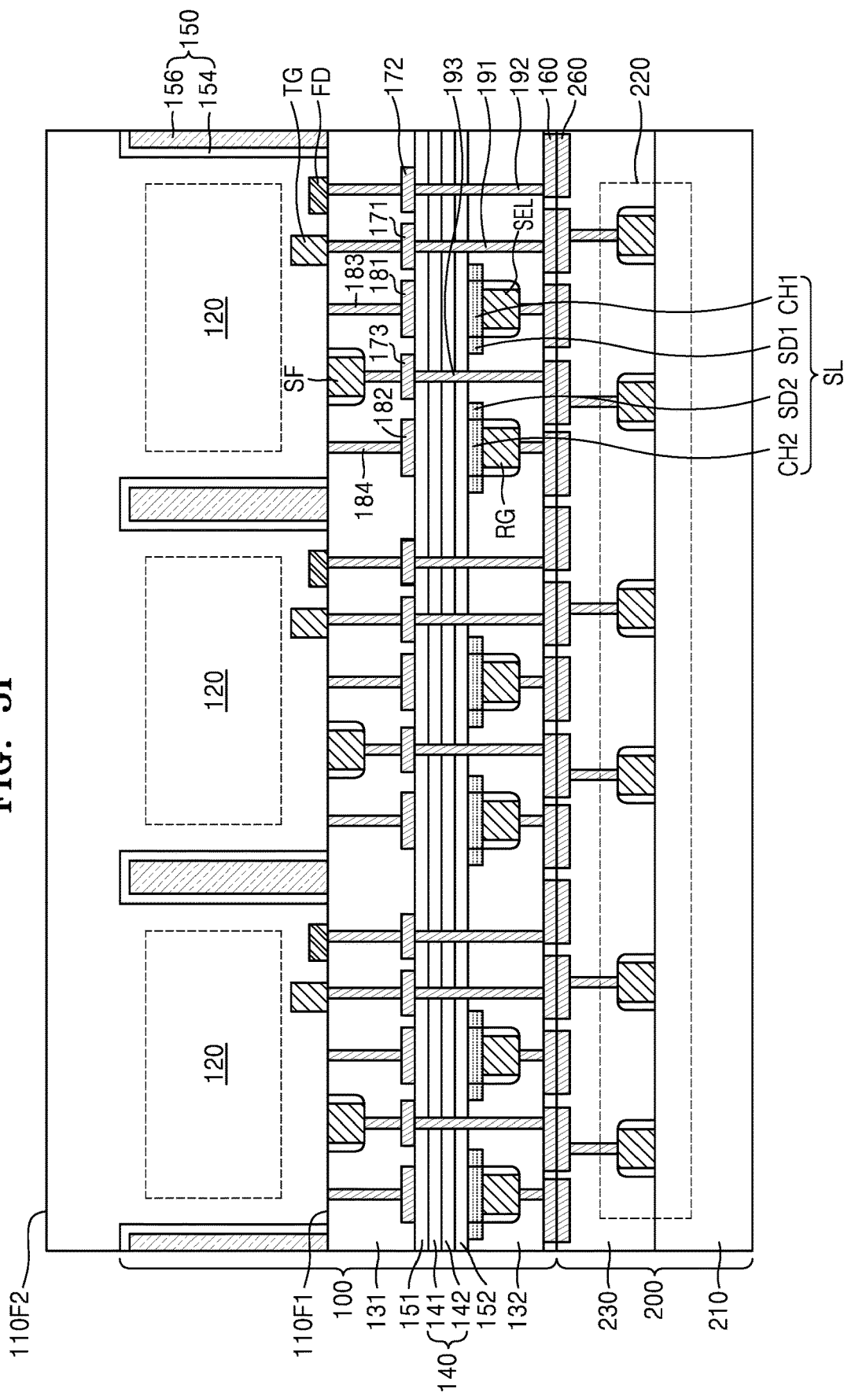

Referring to FIG. 5I, the pixel structure 100 and the logic structure 200 may contact each other so that the plurality of first bonding pads 160 and the plurality of second bonding pads 260 may contact each other. For example, the plurality of first bonding pads 160 and the plurality of second bonding pads 260 may be directly bonded to each other. In some embodiments, heat and/or pressure may be applied to the first substrate 110 and/or the second substrate 210 to form direct bonding between the plurality of first bonding pads 160 and the plurality of second bonding pads 260.

Figure 5J:
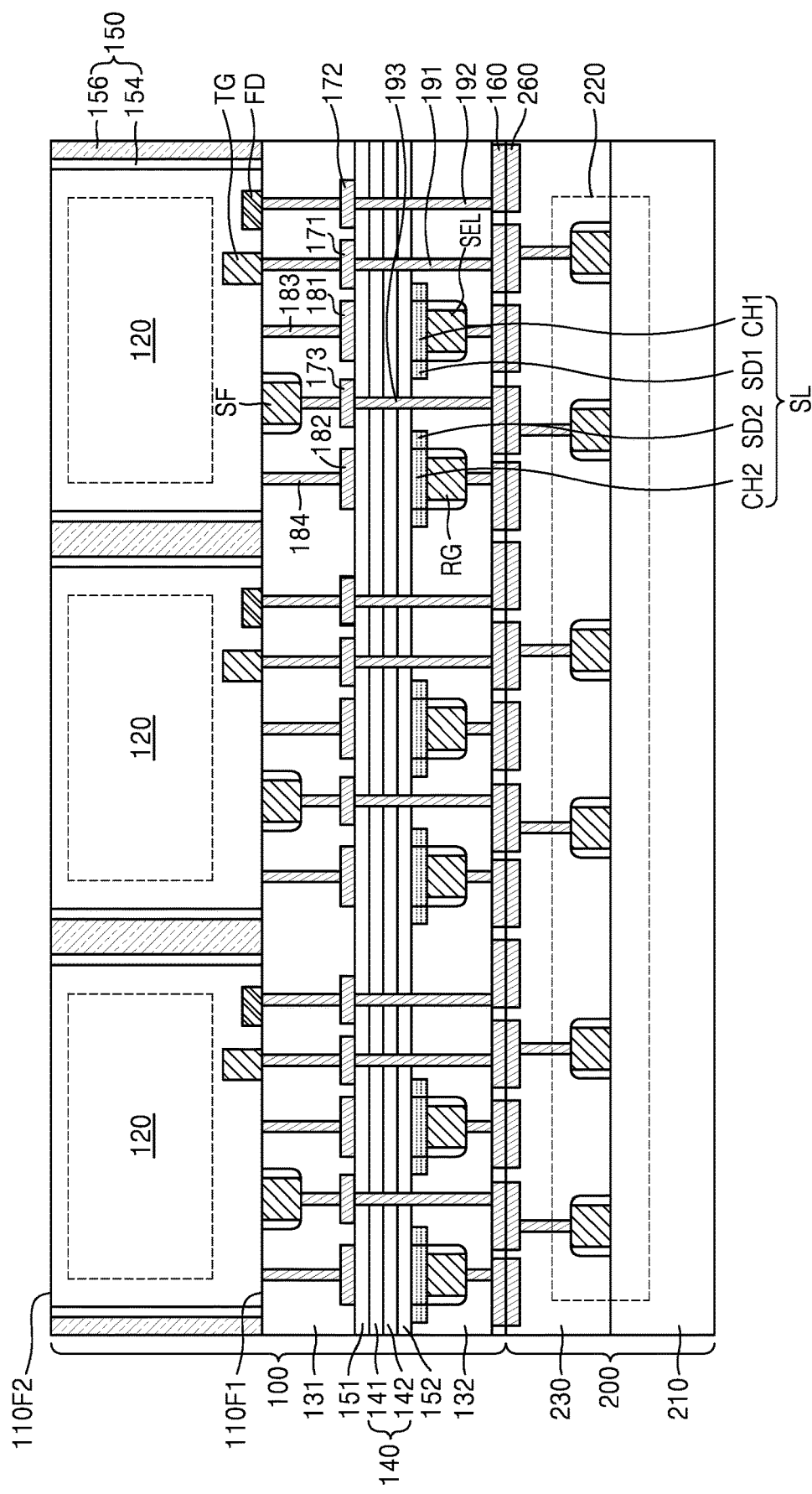

Referring to FIGS. 5I and 5J, a planarization process may be performed on the second facet 110F2 of the first substrate 110 so that the conductive layer 156 may be exposed.

Referring to FIG. 1, an anti-reflection layer 361 may be formed on the second facet 110F2 of the first substrate 110. A fence 363 may then be formed on the anti-reflection layer 361. A color filter may then be formed on the anti-reflection layer 361. A micro lens 380 may then be formed on the color filter 370 and the fence 363. For example, a micro lens material layer may be formed on the color filter 370 and the fence 363, and a mask pattern may be formed on the micro lens material layer. In an embodiment, a reflow process may then be performed to transform the mask pattern into a hemispherical shape. The micro lens material layer may then be etched by using the mask pattern as an etching mask so that a micro lens 380 may be formed. A capping layer 390 may then be formed on the micro lens 380. Thus, the image sensor 1000 may be formed.

While the present inventive concept has been particularly shown and described with reference to embodiments thereof, it will be understood that various changes in form and details may be made therein without departing from the spirit and scope of the present inventive concept.

What is claimed is:

1. An image sensor comprising:
   a first substrate;
   a photoelectric conversion region in the first substrate;
   a first interlayer insulating layer on the first substrate and positioned above the photoelectric conversion region;
   a transistor that includes a bonding insulating layer on the first interlayer insulating layer and positioned above the first interlayer insulating layer, a semiconductor layer on the bonding insulating layer, and a first gate on the semiconductor layer;
   a bias pad that is spaced apart from the semiconductor layer by the bonding insulating layer, the bias pad overlaps the first gate in a planar view; and
   a second interlayer insulating layer covering the transistor.

2. The image sensor of claim 1, wherein the bias pad is configured to receive a voltage.

3. The image sensor of claim 2, wherein the bias pad is configured to adjust a threshold voltage of the transistor.

4. The image sensor of claim 1, wherein the transistor includes a fully depleted silicon on insulator (FD SOI) transistor or a partially depleted silicon on insulator (PD SOI) transistor.

5. The image sensor of claim 1, further comprising a bias via penetrating the first interlayer insulating layer and directly contacting the bias pad.

6. The image sensor of claim 1, wherein a top surface of the bias pad is coplanar with a top surface of the first interlayer insulating layer.

7. The image sensor of claim 1, further comprising:
a first intervening layer between the first interlayer insulating layer and the bonding insulating layer; and
a second intervening layer between the semiconductor layer and the bonding insulating layer.

8. The image sensor of claim 1, further comprising:
a connection pad between the first interlayer insulating layer and the bonding insulating layer; and
a connection via penetrating the second interlayer insulating layer and the bonding insulating layer and directly contacting the connection pad.

9. The image sensor of claim 8, further comprising a second gate on the first substrate, wherein the connection pad is connected to the second gate.

10. The image sensor of claim 8, further comprising an impurity region in the first substrate, wherein the connection pad is connected to the impurity region.

11. The image sensor of claim 8, wherein a top surface of the connection pad is coplanar with a top surface of the first interlayer insulating layer.

12. The image sensor of claim 8, further comprising:
a first bonding pad directly connected to the connection via and positioned on the second interlayer insulating layer; and
a logic structure on the second interlayer insulating layer and the first bonding pad,
wherein the logic structure comprises:
a second substrate;
a logic circuit on the second substrate;
a third interlayer insulating layer covering the second substrate and the logic circuit; and
a second bonding pad positioned on the third interlayer insulating layer, connected to the logic circuit, and directly contacting the first bonding pad.

13. An image sensor comprising:
a substrate;
a photoelectric conversion region in the substrate;
a transfer gate on the substrate;
a first interlayer insulating layer covering the substrate and the transfer gate;
a first connection pad positioned on the first interlayer insulating layer and connected to the transfer gate;
a bias pad positioned on the first interlayer insulating layer;
a bonding insulating layer on the first interlayer insulating layer, the first connection pad, and the bias pad;
a semiconductor layer on the bonding insulating layer;
a selection gate positioned on the semiconductor layer and overlapping the bias pad in a planar view;
a second interlayer insulating layer covering the selection gate; and
a first connection via penetrating the second interlayer insulating layer and the bonding insulating layer and directly contacting the first connection pad.

14. The image sensor of claim 13, further comprising:
a floating diffusion region in the substrate;
a second connection pad positioned between the first interlayer insulating layer and the bonding insulating layer and connected to the floating diffusion region; and
a second connection via penetrating the second interlayer insulating layer and the bonding insulating layer and directly contacting the second connection pad.

15. The image sensor of claim 13, further comprising:
a source follower gate on the substrate;
a third connection pad positioned between the first interlayer insulating layer and the bonding insulating layer and connected to the source follower gate; and
a third connection via penetrating the second interlayer insulating layer and the bonding insulating layer and directly contacting the third connection pad.

16. The image sensor of claim 13, further comprising:
a reset gate on the substrate;
a fourth connection pad positioned between the first interlayer insulating layer and the bonding insulating layer and connected to the reset gate; and
a fourth connection via penetrating the second interlayer insulating layer and the bonding insulating layer and directly contacting the fourth connection pad.

17. The image sensor of claim 13, further comprising a reset gate on the semiconductor layer.

18. The image sensor of claim 13, wherein a thickness of the semiconductor layer is in a range of about 1 nm to about 10 nm.

19. The image sensor of claim 13, wherein a top surface of the first connection pad, a top surface of the bias pad, and a top surface of the first interlayer insulating layer are coplanar with each other.

20. An image sensor comprising:
a pixel structure; and
a logic structure on the pixel structure, wherein
the pixel structure comprises:
a first substrate;
a photoelectric conversion region in the first substrate;
a first interlayer insulating layer on the first substrate;
a bonding insulating layer on the first interlayer insulating layer;
a semiconductor layer on the bonding insulating layer;
a gate on the semiconductor layer;
a bias pad that is spaced apart from the semiconductor layer by the bonding insulating layer and overlaps the gate in a planar view;
a second interlayer insulating layer covering the gate;
a first bonding pad positioned on the second interlayer insulating layer and connected to the gate, wherein
the logic structure comprises:
a second substrate;
a logic circuit on the second substrate;
a third interlayer insulating layer covering the second substrate and the logic circuit; and
a second bonding pad positioned on the third interlayer insulating layer and connected to the logic circuit, wherein
the first bonding pad directly contacts the second bonding pad.

* * * * *